US009166083B2

(12) United States Patent
Meinel et al.

(10) Patent No.: US 9,166,083 B2
(45) Date of Patent: Oct. 20, 2015

(54) REDUCING THERMAL GRADIENTS TO IMPROVE THERMOPILE PERFORMANCE

(71) Applicant: Texas Instruments Incorporated, Dallas, TX (US)

(72) Inventors: Walter Meinel, Tucson, AZ (US); Kalin Lazarov, Colorado Springs, CO (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 120 days.

(21) Appl. No.: 13/783,737

(22) Filed: Mar. 4, 2013

(65) Prior Publication Data

US 2013/0175072 A1 Jul. 11, 2013

Related U.S. Application Data

(62) Division of application No. 12/878,572, filed on Sep. 9, 2010, now Pat. No. 8,411,442.

(51) Int. Cl.
*H05K 7/20* (2006.01)
*H01L 31/024* (2014.01)
*H05K 1/02* (2006.01)
*H05K 1/11* (2006.01)

(52) U.S. Cl.
CPC ............ *H01L 31/024* (2013.01); *H05K 1/0201* (2013.01); *H05K 1/113* (2013.01); *H05K 1/115* (2013.01); *H05K 2201/062* (2013.01); *H05K 2201/10121* (2013.01); *H05K 2201/10151* (2013.01)

(58) Field of Classification Search
CPC ............ H05K 1/00; H05K 1/16; H05K 5/00; H05K 7/00; H05K 7/20
USPC ........................ 361/676–678, 679.46–679.54, 361/688–722, 748–751, 760–783, 831; 174/50.52, 51, 71 R, 72 R, 250, 252, 174/255, 258, 260–263, 547–578
See application file for complete search history.

(56) References Cited

U.S. PATENT DOCUMENTS

| 4,481,403 | A | * | 11/1984 | Del Monte | 219/209 |
| 5,049,978 | A | * | 9/1991 | Bates et al. | 257/686 |
| 5,090,918 | A | * | 2/1992 | Zoellick et al. | 439/487 |
| 5,783,805 | A | * | 7/1998 | Katzmann | 219/494 |
| 6,068,400 | A | * | 5/2000 | Nelson et al. | 374/179 |
| 6,293,700 | B1 | * | 9/2001 | Lund et al. | 374/181 |
| 6,423,940 | B1 | * | 7/2002 | Schupbach | 219/209 |
| 8,125,064 | B1 | * | 2/2012 | Lee et al. | 257/684 |
| 2005/0061980 | A1 | * | 3/2005 | Iida et al. | 250/338.4 |
| 2005/0224946 | A1 | * | 10/2005 | Dutta | 257/686 |
| 2007/0138395 | A1 | * | 6/2007 | Lane et al. | 250/353 |
| 2009/0250808 | A1 | * | 10/2009 | Lewis et al. | 257/713 |
| 2011/0272581 | A1 | * | 11/2011 | Noda | 250/338.3 |

* cited by examiner

*Primary Examiner* — Courtney Smith
(74) *Attorney, Agent, or Firm* — Lawrence J. Bassuk; Charles A. Brill; Frank D. Cimino

(57) ABSTRACT

With infrared (IR) sensors, repeatability and accuracy can become an issue when there are thermal gradients between the sensor and an underlying printed circuit board (PCB). Conventionally, a large thermal mass is included in the sensor packaging to reduce the effect from such thermal gradients, but this increase costs and size of the sensor. Here, however, a PCB is provided that includes an isothermal cage included therein that generally ensures that the temperature of the underlying PCB and sensor are about the same by including structural features (namely, the isothermal cage) that generally ensure that the thermal time constant for a path from a heat source to the thermopile (which is within the sensor) is approximately the same as thermal time constants for paths through the PCB.

10 Claims, 9 Drawing Sheets

REDUCING THERMAL GRADIENTS TO IMPROVE THERMOPILE PERFORMANCE

This Application is a Divisional of prior application Ser. No. 12/878,572, filed Sep. 9, 2010, now U.S. Pat. No. 8,411,442, issued Apr. 2, 2013.

TECHNICAL FIELD

The invention relates generally to infrared (IR) sensors and, more particularly, to reducing sensitivity to thermal gradients of a printed circuit board (PCB) when using IR sensors.

BACKGROUND

Referring to FIG. 1A of the drawings, the reference numeral 100 generally designates conventional PCB that is adapted to use for four IR sensors, where the section 101 (for one of the sensors) is shown in greater detail in FIG. 1B. As shown, there is an integrated circuit (IC) seat 102 that is adapted to receive an IC that includes an IR sensor. For this configuration, the package for the sensor is a wafer level chip scale package (WCSP) that can be secured to the PCB 100 at IC seat 102 (for example) with eight solder balls. For each of the contact pads (which are located within the IC seat 102 and are adapted to be secured to a solder ball), there are traces 108-1 through 108-8 to provide electrical connections for the IC. Additionally, a capacitor seat 104 and resistor seat 106 are also shown. With this circuit layout, the traces (and all other conductive material) are laid out in a generally linear and symmetrical pattern.

Turning now to FIG. 2, the response of the four IR sensors, which are secured to the PCB 100, can be seen. When a black body is swept from 0° C. to 120° C. (as shown in FIG. 2), the average output voltage for the sensors varies by 10-to-1. For example, at 115° C., the sensor outputs vary between 55 µV and 550 µV. Clearly, repeatability is very poor. This drastic variation, however, can be attributed to the sensitivity of IR sensors. In particular, the IR sensors are very sensitive to thermal gradients between the sensor and the underlying PCB (i.e., PCB 100). Because the IR sensor is sensitive to changes in temperature between the "cold junction" and "hot junction," when there are temperature variations or thermal gradients between the package and the underlying PCB (i.e., PCB 100), thermal gradients will induce small temperature changes of the hot junction which may cause the IR senor to generate false signals. Thus, thermal transients (which can create large thermal variations across a PCB) can create temperature readings (when detecting IR) that vary wildly.

One known solution for this problem is to employ a large thermal mass on the sensor package to reduce the effects of thermal gradients. This type solution is described by: Liess et al., "Reducing thermal transient induced errors in thermopile sensors in ear thermometer applications," *Sensors and Actuators A*, Vol. 154, No. 1, 2009, pgs 1-6. However, using a large thermal mass increases the size and cost of the sensor, which can be prohibitive in some applications.

Therefore, there is a need for an improved apparatus and/or system that reduces thermal gradients.

Some other conventional systems are: U.S. Pat. No. 5,344,518; U.S. Pat. No. 6,637,931; U.S. Pat. No. 7,275,867; U.S. Pat. No. 7,435,964; and U.S. Patent Pre-Grant Publ. No. 2003/0016729.

SUMMARY

A preferred embodiment of the present invention, accordingly, provides an apparatus. The apparatus comprises an integrated circuit (IC) seat; a plurality of contact pads located within the IC seat; an isothermal cage that substantially surrounds the IC seat, wherein the isothermal cage is formed at least in part of a thermally conductive material; a plurality of contact vias; a plurality of traces, wherein at least one trace is coupled between at least one of the contact pads and at least one of the contact vias; and a thermal isolation region that substantially surrounds the isothermal cage.

In accordance with a preferred embodiment of the present invention, the apparatus further comprises a thermal isolation via that is located along the periphery of the IC seat, wherein the isothermal cage is thermally coupled to the isolation via.

In accordance with a preferred embodiment of the present invention, the isothermal cage further comprises a thermally conductive dot that is located at the center of the IC seat and that is thermally coupled to the thermal isolation via.

In accordance with a preferred embodiment of the present invention, the apparatus further comprises a top surface, and wherein the isothermal cage further comprises a plurality of metal layers located below the top surface, and wherein each metal layer is substantially parallel to the top surface.

In accordance with a preferred embodiment of the present invention, the metal layers and the thermally conductive dot are formed of copper, and wherein the conductive dot, the thermal isolation via, and the isothermal cage are electrically connected together.

In accordance with a preferred embodiment of the present invention, the IC seat is about 0.06 in by about 0.06 in, and wherein the conductive dot is about 0.015 in by about 0.15 in.

In accordance with a preferred embodiment of the present invention, each contact via is located along the periphery of the IC seat.

In accordance with a preferred embodiment of the present invention, each contact via is located in the thermal isolation region.

In accordance with a preferred embodiment of the present invention, an apparatus is provided. The apparatus comprises a circuit board having: an IC seat; a plurality of contact pads located within the IC seat; an isothermal cage that substantially surrounds the IC seat, wherein the isothermal cage is formed at least in part of a thermally conductive material; a plurality of contact vias; a plurality of traces, wherein at least one trace is coupled between at least one of the contact pads and at least one of the contact vias; and a thermal isolation region that substantially surrounds the isothermal cage; and an IC that is secured to each contact pad and that is generally coextensive with the IC seat.

In accordance with a preferred embodiment of the present invention, the IC further comprises: a substrate; an infrared (IR) sensor that is located in the substrate; and active circuitry that is located in the substrate.

In accordance with a preferred embodiment of the present invention, the apparatus further comprises a plurality of solder balls, wherein each solder ball is secured between the IC and at least one circuit board contact pads.

In accordance with a preferred embodiment of the present invention, an apparatus is provided. The apparatus comprises an IC having: a substrate; a thermopile located in the substrate; and a first thermal time constant for a first path from a heat source to the thermopile; and a circuit board having: a plurality of circuit board contact pad that are each secured to the IC; and an isothermal cage formed within the circuit board, wherein the isothermal cage adjusts a second thermal time constant for a second path from the heat source to the thermopile through the circuit board so that the second thermal time constant is approximately equal to the first thermal time constant.

In accordance with a preferred embodiment of the present invention, the isothermal cage further comprises a thermally conductive dot that is located below the center of the IC.

In accordance with a preferred embodiment of the present invention, the circuit board further comprises a top surface, and wherein the isothermal cage further comprises a plurality of metal layers located below the top surface, and wherein each metal layer is substantially parallel to the top surface, and wherein the metal layers and the thermally conductive dot are thermally coupled to one another.

In accordance with a preferred embodiment of the present invention, the metal layers and the thermally conductive dot are formed of copper.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1A:
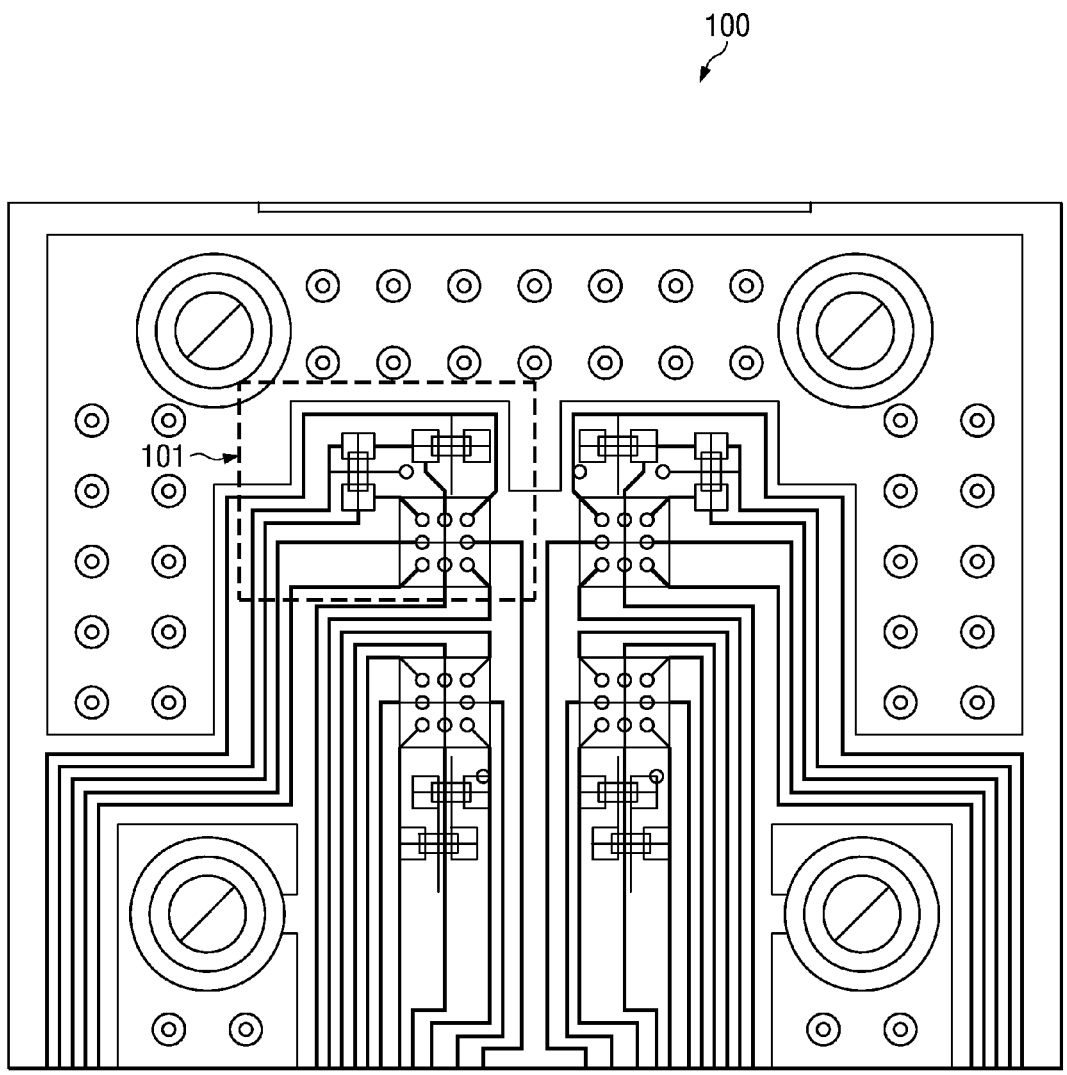
FIGS. 1A and 1B are block diagrams illustrating the layout for a convention PCB for four IR sensors.
Figure 1B:
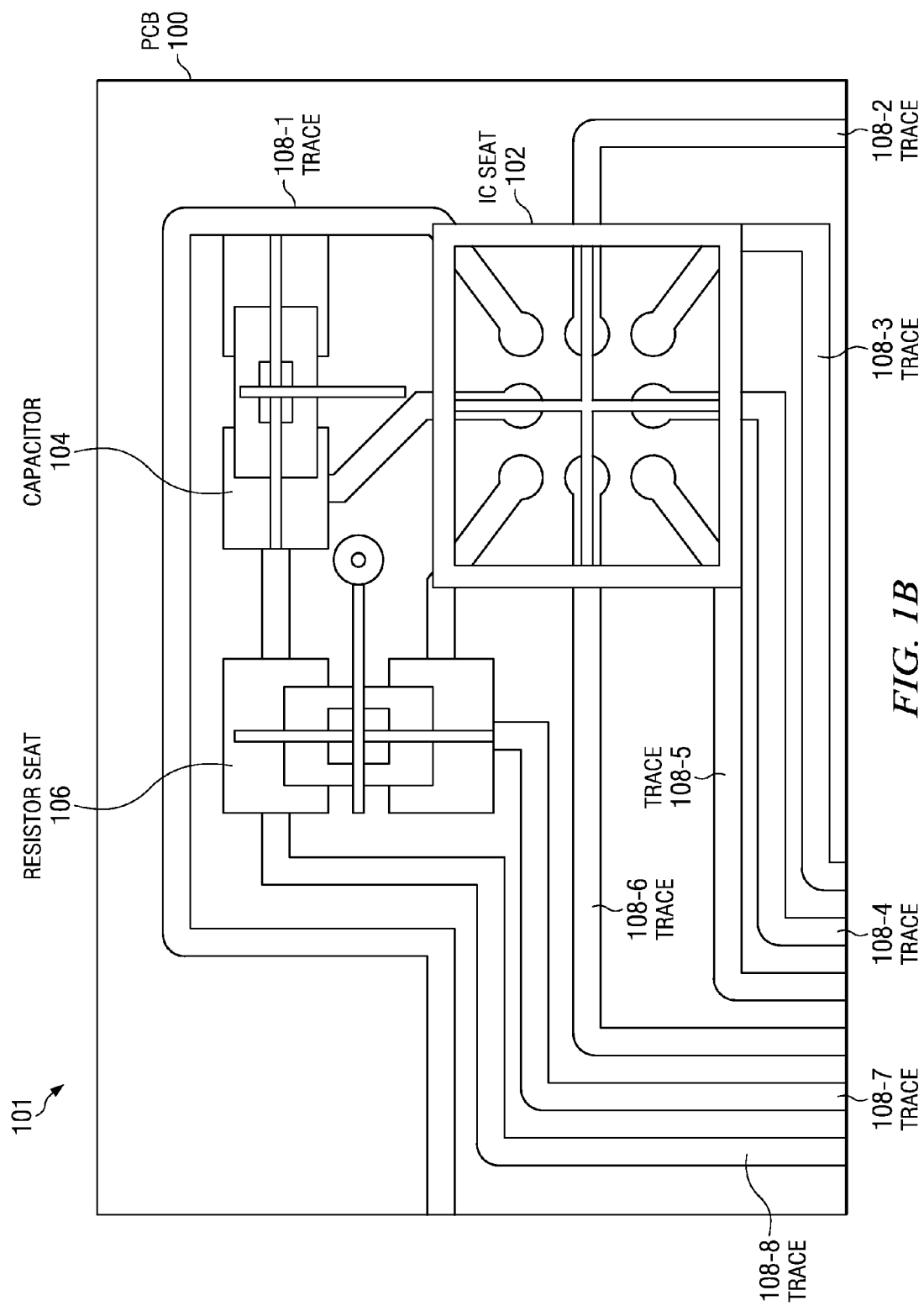

Refer now to the drawings wherein depicted elements are, for the sake of clarity, not necessarily shown to scale and wherein like or similar elements are designated by the same reference numeral through the several views.

Figure 3:
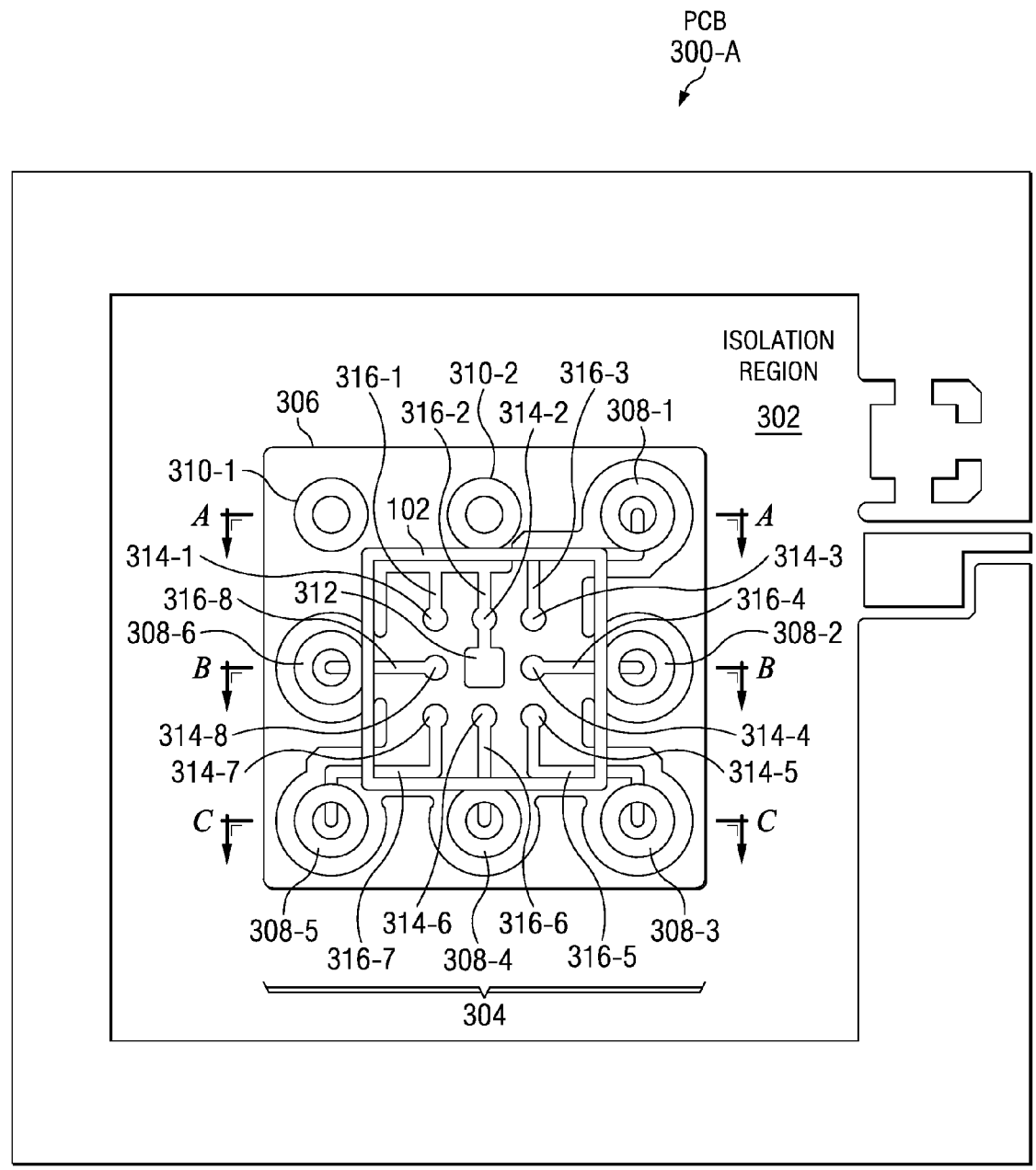
FIG. 3 is a block diagram for the layout on a PCB of an IR sensor in accordance with a preferred embodiment of the present invention.

Turning to FIG. 3, a PCB 300-A in accordance with a preferred embodiment of the present invention can be seen. Instead of employing a large thermal mass (as part of the sensor housing), a solution is provided that integrates features substantially seamlessly into a PCB 300-A that reduce thermal gradients across the IC seat 102. To accomplish this, PCB 300-A, preferably, employs an isothermal cage 304 that substantially surrounds an IC seat 102 to substantially thermally isolate the portion of the PCB 300-A that underlies the sensor (beneath the IC seat 102). Generally, this isothermal cage 304 is formed of a thermal conductor 306 (such as copper) arranged at the periphery of the isothermal cage and is thermally coupled to thermal isolation vias 310-1 and 310-2, which are also generally formed of a conductive material, like copper. These isolation vias 310-1 and 310-2 are generally formed along the periphery of the IC seat 102 and extend vertically through the PCB 300-A. Typically, the thermal coupling is an electrical connection that allows the thermal conductor 306 to be at generally the same electrical potential as vias 310-1 and 310-2. In addition to be thermally coupled to vias 310-1 and 310-2, contact pads 314-1 and 314-2 are thermally coupled to isothermal cage 304 through traces 316-1 and 316-2 (which can also be formed of copper). These contact pads 314-1 and 314-2 are located within the IC seat 102 and are generally adapted to be electrically connected to the "ground pins" of an IR sensor (not shown).

Also, within the isothermal cage 304, there are several contact vias 308-1 to 308-6. These contact vias 308-1 to 308-6 generally allow for communications between the IR sensor (not shown) and other circuitry. Generally, these contact vias 308-1 to 308-6 are formed along the periphery of IC 102 and extend vertically through the PCB 300-A, similar to isolation vias 310-1 and 310-2. Preferably, these contact vias 308-1 to 308-6 are thermally and electrically isolated from the thermal conductor 306, but are electrically connected to contact pads 314-3 to 314-8 (which are within the IC seat 102) through traces 316-3 to 316-8 (respectively). Similar to isolation vias 310-1 and 310-2, contact pads 314-1 and 314-2, and traces 316-1 and 316-2, contact vias 308-1 to 308-6, contact pads 314-3 to 314-8, and traces 316-3 to 316-8 can also be formed of copper. A reason for including the contact vias 308-1 to 308-6 within the isothermal cage 304 is to generally ensure that all of the traces 316-1 to 316-8 are directly connected to a connecting member (i.e., solder ball) at generally the same temperature.

In addition to having thermal conductor 306, the isothermal cage 304 also employs a thermally conductive dot 312. This conductive dot 312 is, preferably, thermally coupled to thermal conductor 306, and is generally located near the center of both the IC seat 102 and the IR sensor. As with thermal conductor 306, conductive dot 312 can also be formed of copper. This conductive dot 312 has a great deal of influence in matching the thermal response time of the IR sensor (not shown) to the PCB 300-A underling the IR sensor (not shown), even though the conductive dot 312 is relatively small. For example, for an isothermal cage 304 measuring about 0.075 in by about 0.075 in, which can accommodate a IC seat 102 (and IR sensor) with an area of about 0.06 in by about 0.06 in, with vias 310-1, 310-2, and 308-1 though 308-6 having a diameter of about 0.015 in, the conductive dot 312 is generally about 0.015 in by about 0.015 in.

Finally, there is also a thermal isolation region 302 that isolates the isothermal cage 304. This isolation region 304 substantially surrounds the isothermal cage 304 along its periphery. Generally, the width of the isolation region 304 is greater than the width of the thermal conductor 306 (which generally extends between the periphery of the IC seat 102 and the periphery of the isothermal cage 304). For example, for an isothermal cage 304 measuring about 0.075 in by about 0.075, which can accommodate an IC seat 102 (and IR sensor) with a size of about 0.06 by about 0.06 in, the width of the isolation region 302 can be about 0.05 in wide.

Figure 4A:
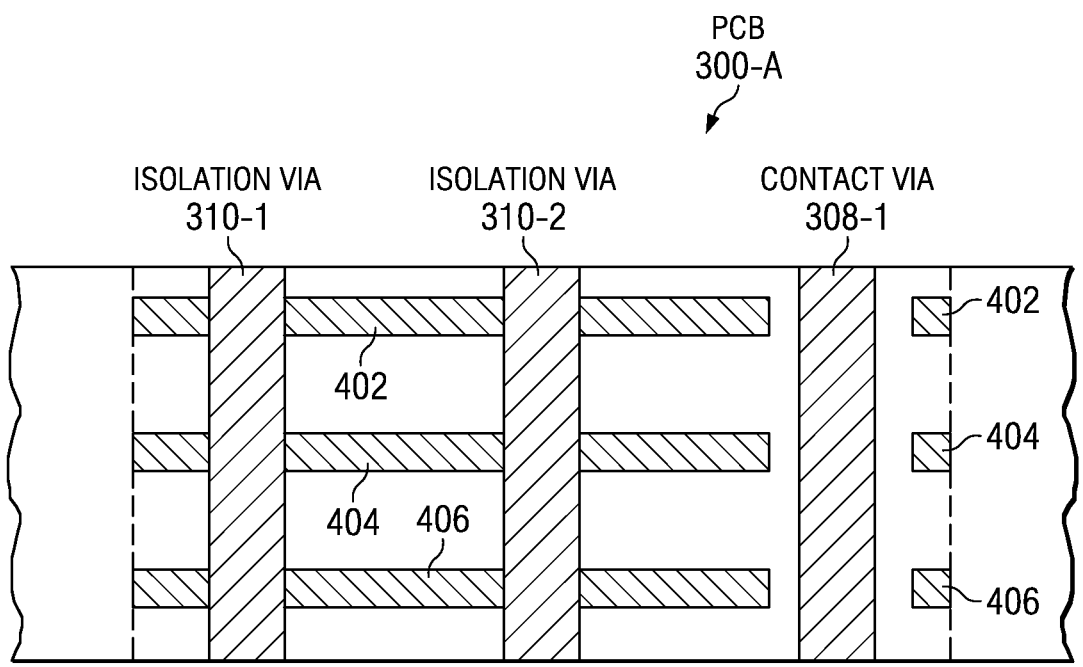
FIG. 4A is a cross-sectional view of the PCB of FIG. 3 across section line A-A.
Figure 4B:
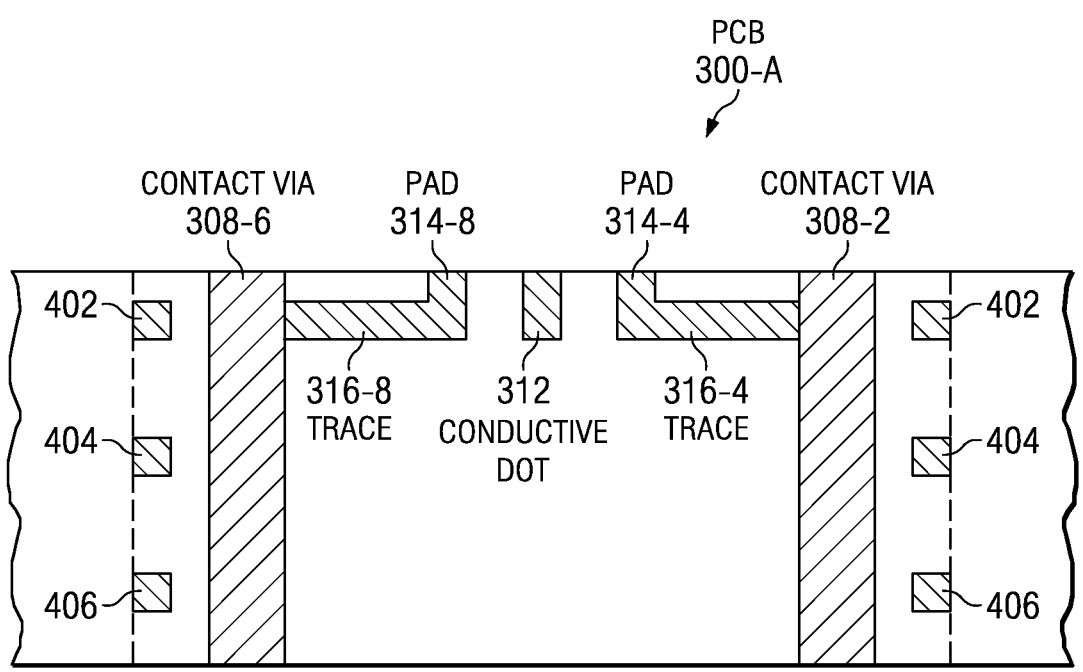
FIG. 4B is a cross-sectional view of the PCB of FIG. 3 across section line B-B.
Figure 4C:
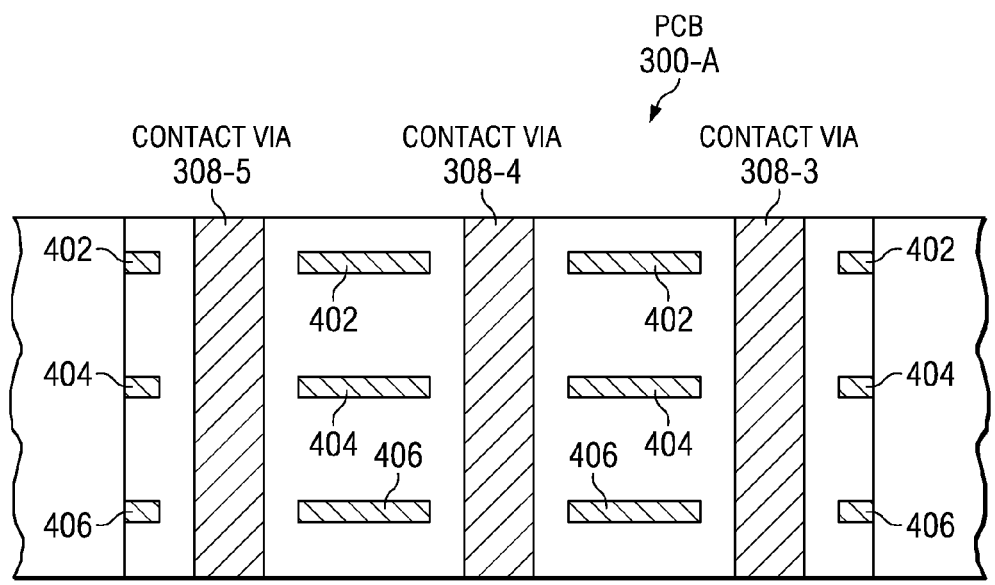
FIG. 4C is a cross-sectional view of the PCB of FIG. 3 across section line C-C.

Turning now to FIGS. 4A through 4C of the drawings, cross-sectional views across section lines A-A, B-B, and C-C of PCB 300-A can be seen. In FIG. 4A, the thermal conductor 306 generally comprises several conductive layers or thermal conductors 402, 404, and 406, which are formed as part of the lamination process used to manufacture PCB 306 and are each substantially parallel to the top surface of PCB 300-A. Typically, these layers or conductors 402, 404, and 406 (which can be formed of copper) are thermally coupled to isolation vias 310-1 and 310-2, while being thermally isolated from contact via 308-1. In FIG. 4B, contact vias 308-6 and 308-2 are thermally isolated from layers or conductors 402, 404, and 406, while being in electrical contact with pads 314-8 and 314-4 (respectively) through traces 316-8 and 316-4. Finally, in FIG. 4C, contact vias 308-3 through 308-5 are thermally isolated from layers or conductors 402, 404, and 406.

Figure 4D:
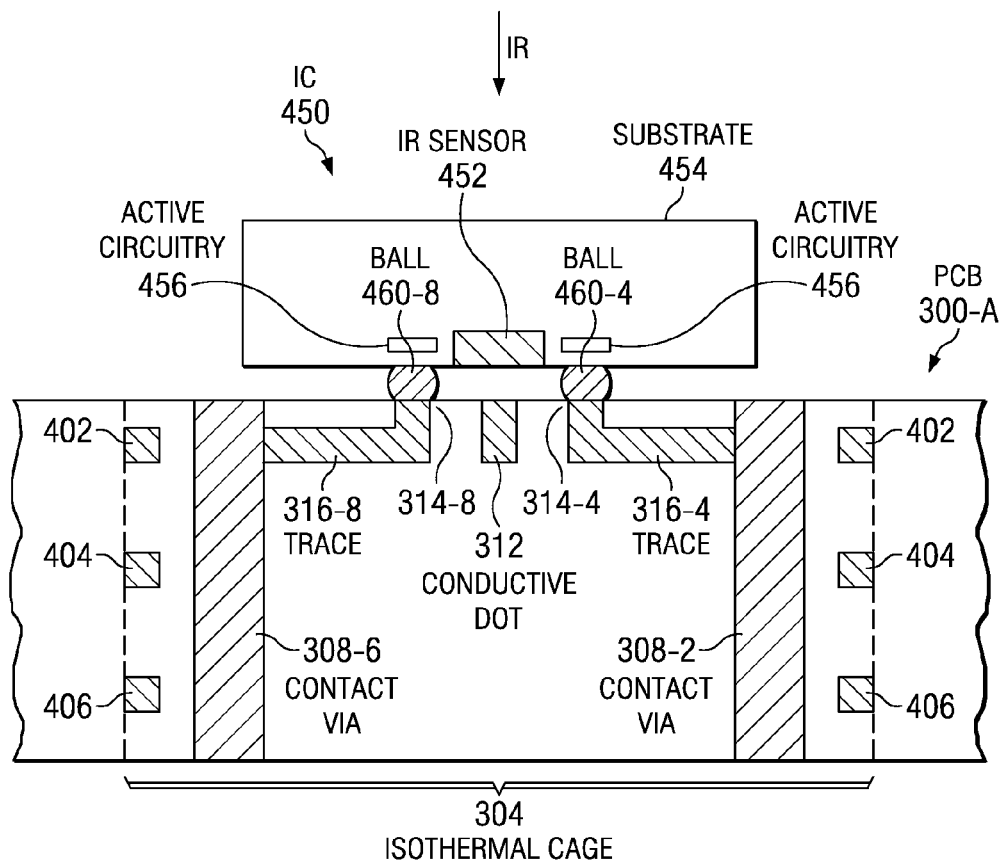
FIG. 4D is a cross-sectional view of the PCB of FIG. 3 across section line B-B with an IR sensor secured to the PCB.

For FIG. 4D, a cross-sectional view of an IC 450 that is secured to PCB 300-A can be seen along section line B-B of FIG. 3. As shown, IC 450, preferably, includes an IR sensor 452 and active circuitry 456 located within a substrate 454 (which is generally formed of silicon). IC 450 is secured to the PCB 300-A with WCSP package, where the substrate 454 operates as the "cold junction" for the IR sensor 452. The IC 450 is electrically connected to and secured to solder balls 460-8 and 460-4 such that the active circuitry 456 extends over the solder balls 460-8 and 460-4. As can be seen, the conductive dot 312 is located underneath IC 454 and substantially at near the center of IC 454 and IR sensor 452. Additionally, because the solder balls (i.e., ball 460-4) are generally aligned with the contact pads (i.e., 314-4) of the PCB 300-A, the IR sensor 450 is generally aligned or is generally coextensive with the IC seat 102. Moreover, the substrate 454 can serve as a visible light filter.

Figure 5:
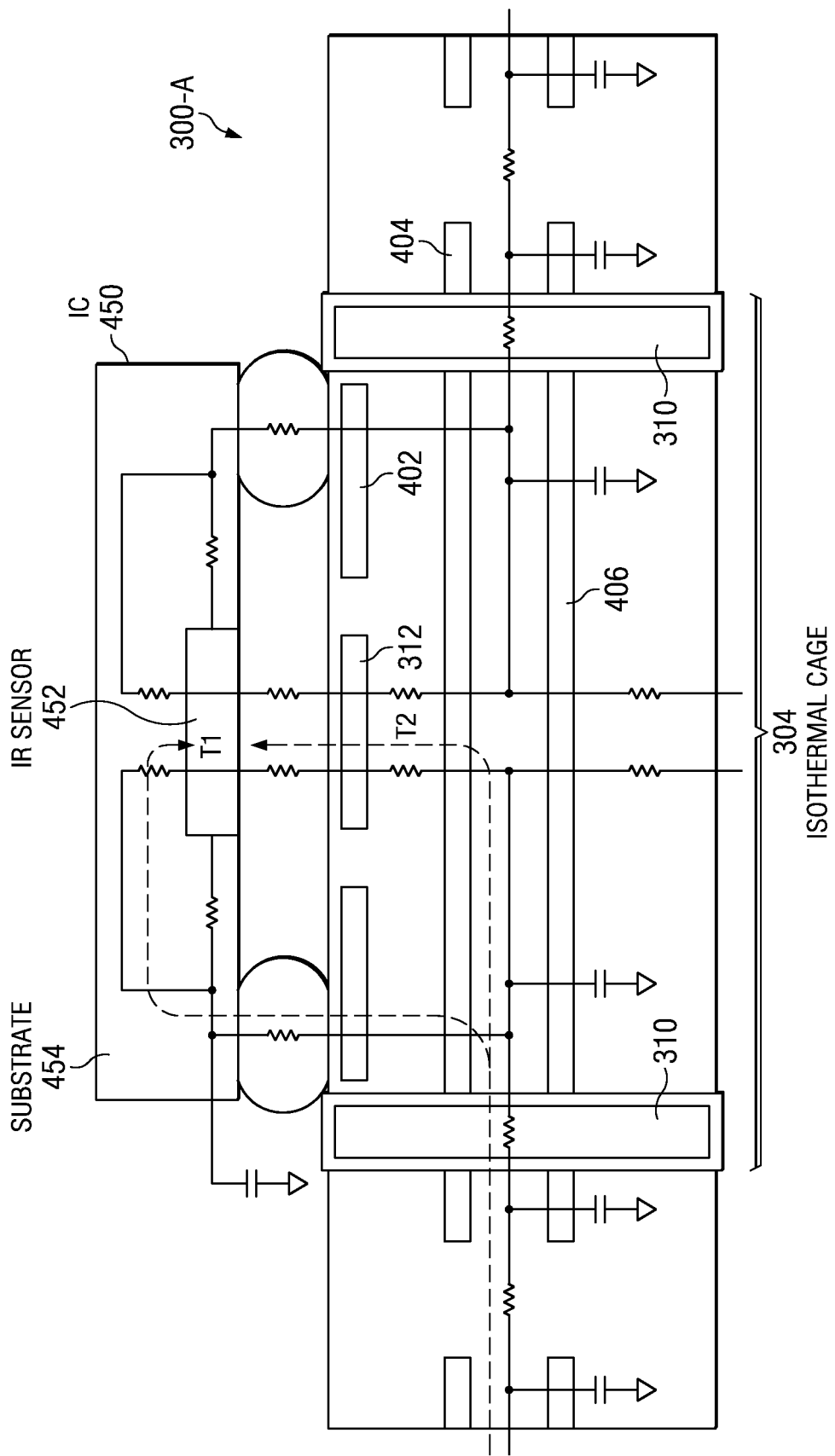
FIG. 5 is a thermal model of operation of the PCB and IR sensor of FIG. 4D.

In order to further illustrate the function of PCB 300-A (and isothermal cage 304), a thermal model of the IR sensor 452 and PCB 300-A can be seen in FIG. 5. Each capacitor and each resistor shown in FIG. 5 respectively corresponds to a thermal capacitance or a thermal resistance. In order to generally ensure that the difference in temperature between IR sensor 452 (T1) and the portion of the PCB 300-A underlying the IR sensor 452 (T2) is generally the same, the thermal time constant for the path from a heat source to the thermopile (which is generally located in IC 450) is approximately equal to the thermal time constant of the paths (which are shown in FIG. 4) from the heat source through the underlying PCB 300-A. Thus, the thermal time constants for the paths through the underlying PCB 300-A are adjusted using the thermal resistances and thermal capacitances (which are provided through the isothermal cage 304).

Figure 6:
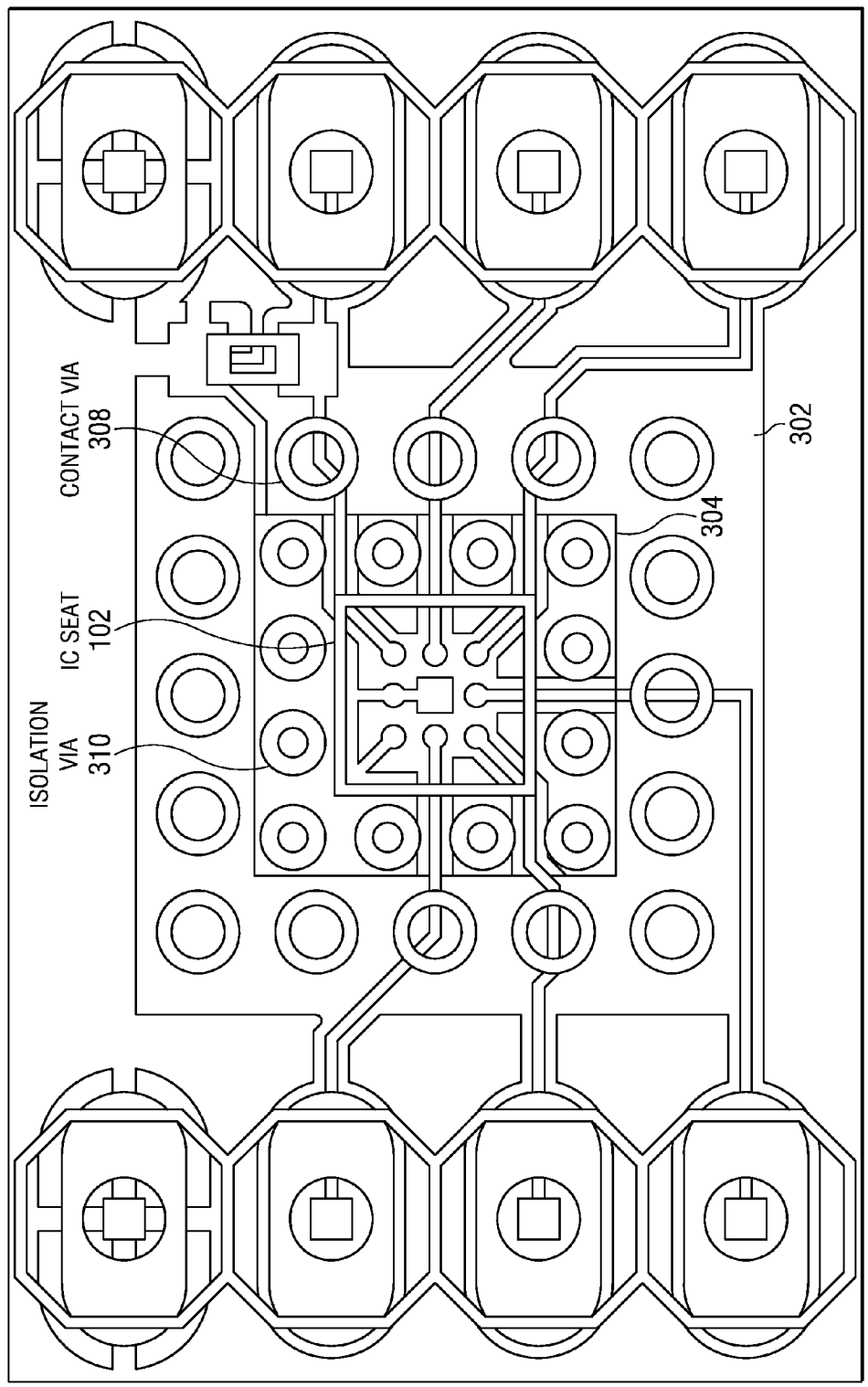
FIG. 6 is a block diagram for the layout on a PCB of an IR sensor in accordance with a preferred embodiment of the present invention.

Turning now to FIG. 6, another example of a PCB 300-B in accordance with a preferred embodiment of the present invention can be seen. Here, isolation vias (herein after referred to as 310) are located within the isothermal cage 304, while the contact vias (hereinafter referred to as 308) are located in the isolation region 302. While the PCB layout of FIG. 6 does provide adequate performance, the performance of the layout of FIG. 3 is better.

Figure 2:
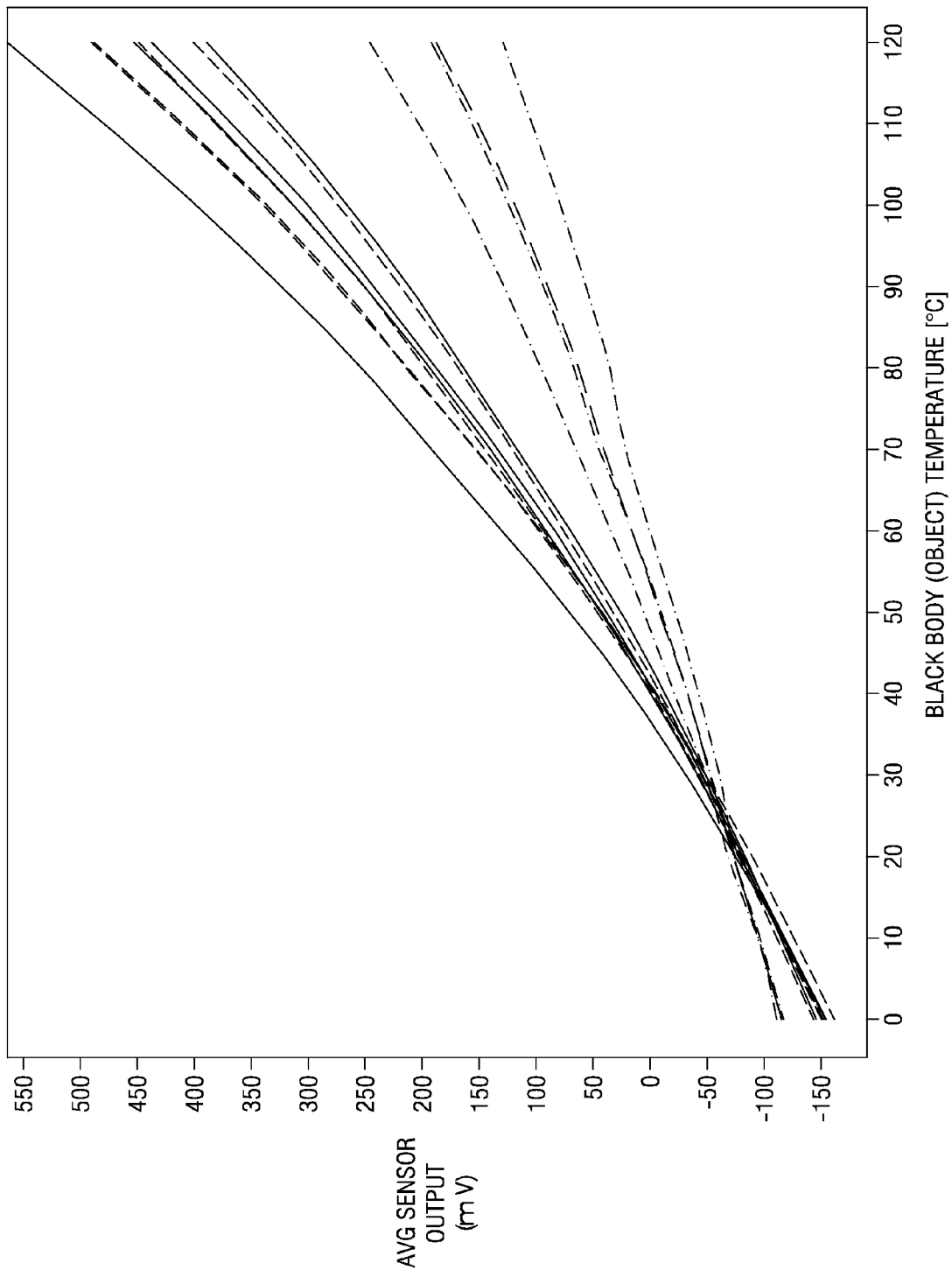
FIG. 2 is a diagram of the response of IR sensors secured to the PCB of FIGS. 1A and 1B.
Figure 7:
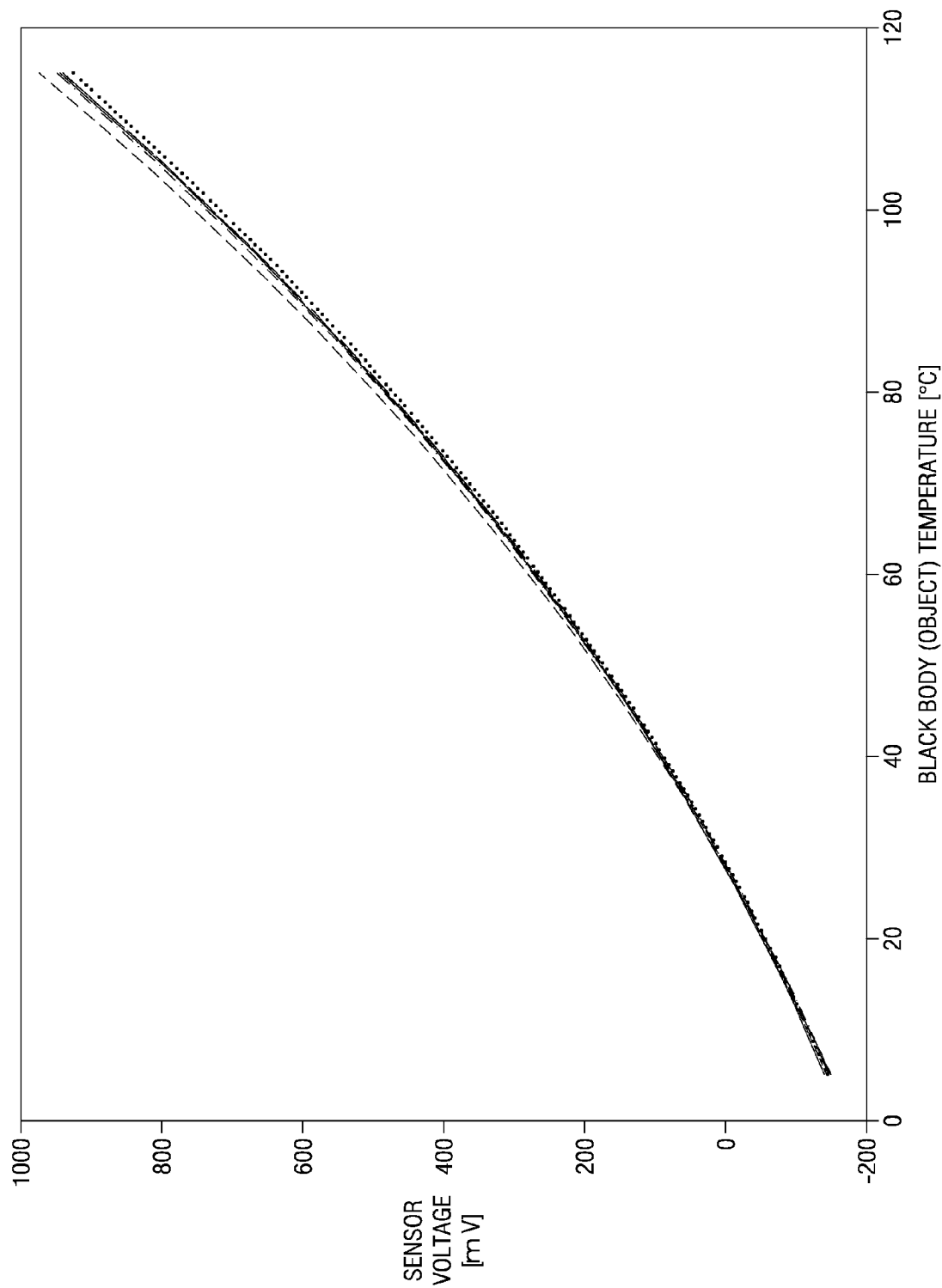
FIG. 7 is a diagram of the response of IR sensors mounted to the PCB of FIG. 3.

To illustrate the performance of the layout of PCB 300-A, which includes four IR sensors that are laid out in a similar manner as PCB 100, a graph of sensor voltage versus black body temperature is shown in FIG. 7. Here, there is a sweep of a black body between about 5° C. and about 115° C., and as compared to FIG. 2, there is a relatively small variance near 120° C. Moreover, there is a noticeable increase in the output voltage of the IR sensors (i.e., IR sensor 450). For example, with the PCB 100 at 115° C., the output for each of the IR sensors varied between 55 μV and 550 μV, whereas, with PCB 300-A (using four IR sensors in a similar manner to PCB 100) at 115° C., the output for each IR sensor was about 1000 μV.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A substrate assembly comprising:
    A. a planar substrate formed of an electrical and thermal insulating material;
    B. an integrated circuit seat formed on a top surface of the substrate, the seat including contact pads and traces extending from the contact pads; and
    C. an isothermal cage in the substrate that substantially surrounds the seat, the cage including thermal conductors in the substrate at the periphery of the cage with the thermal conductors at different levels in the substrate, the isothermal cage including a conductive dot at the center of the integrated circuit seat, the conductive dot having a top surface at the top surface of the substrate and a portion extending part way into the electrical and thermal insulating material of the substrate, the conductive dot being connected to a contact pad by one of the traces at one of the levels in the substrate.

2. The assembly of claim 1 including vias formed through the substrate between the cage and the seat, the vias being filled with an electrically conductive material, a first via being electrically and thermally connected to one of the traces and to the thermal conductors, and a second via being electrically and thermally isolated from the thermal conductors and being electrically connected to another one of the traces.

3. The assembly of claim 2 in which the first via is connected to a circuit ground trace and contact pad.

4. The assembly of claim 2 in which the second via is connected to a trace to be connected to other circuitry.

5. The assembly of claim 1 in which the seat has dimensions of approximately 0.06 inch by 0.06 inch and the cage has dimensions of approximately 0.075 inch by 0.075 inch.

6. The assembly of claim 2 in which the vias have a diameter of approximately 0.015 inch.

7. The assembly of claim 1 in which the thermal conductors are laminations in the substrate.

8. The assembly of claim 1 in which the substrate is a printed circuit board.

9. The assembly of claim 2 in which the conductive dot is thermally connected to the first via.

10. The assembly of claim 1 in which the conductive dot has dimensions of about 0.015 inch by 0.015 inch.

* * * * *